US012640178B2

(12) United States Patent
Klauss et al.

(10) Patent No.: US 12,640,178 B2
(45) Date of Patent: *May 26, 2026

(54) METHOD FOR OPERATING A DATA PROCESSING SYSTEM

(71) Applicant: Robert Bosch GmbH, Stuttgart (DE)

(72) Inventors: Michael Klauss, Backnang (DE);
Rainer Baumgaertner, Pfaffenhofen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 197 days.

This patent is subject to a terminal disclaimer.

(21) Appl. No.: 18/535,308

(22) Filed: Dec. 11, 2023

(65) Prior Publication Data

US 2024/0203470 A1      Jun. 20, 2024

(30) Foreign Application Priority Data

Dec. 20, 2022    (DE) ..................... 10 2022 214 055.9

(51) Int. Cl.
*G11C 7/22*              (2006.01)
(52) U.S. Cl.
CPC .............. *G11C 7/222* (2013.01); *G11C 7/225* (2013.01)
(58) Field of Classification Search
CPC ....... G11C 7/222; G11C 7/225; G06F 9/4881; G06F 9/461; G06F 2209/484
See application file for complete search history.

(56) References Cited

U.S. PATENT DOCUMENTS

| | | | | |
|---|---|---|---|---|
| 12,159,057 B2 * | 12/2024 | Hsu | .......................... | G06F 8/453 |
| 12,175,285 B1 * | 12/2024 | Zisman | ................... | G06F 13/28 |
| 2006/0179436 A1 * | 8/2006 | Yasue | ....................... | G06F 8/45 718/100 |
| 2010/0122045 A1 * | 5/2010 | Huetter | .................... | G06F 5/16 711/E12.001 |

OTHER PUBLICATIONS

Andersn and Holman: "Efficient Pure-buffer Algorithms for Real-time Systems," Proceedings of Seventh International Conference on Real-Time Computing Systems and Applications, Cheju, Korea (South), IEEE (2000), pp. 57-64, doi:10.1109/RTCS.2000.896371.
Shi, et al.: "Multiprocessor Synchronization of Periodic Real-Time Tasks Using Dependency Graphs," 2019 IEEE Real-Time and Embedded Technology and Applications Symposium (RTAS), Montreal, QC, Canada, (2019), pp. 279-292, doi:10.1109/RTA.2019.00031.

* cited by examiner

*Primary Examiner* — Douglas King
*Assistant Examiner* — Christopher Lane Reece
(74) *Attorney, Agent, or Firm* — NORTON ROSE FULBRIGHT US LLP

(57)              ABSTRACT

A method for operating a data processing system for processing data. The data processing system is set up for the repeated execution of a plurality of data processing tasks. The following steps are carried out for the operation of the data processing system: a) executing the individual data processing tasks at their respective repetition rate in the time grid; b) outputting of output data by the individual data processing tasks into the buffer memory assigned to the clock pulse of the grid; c) reading in of input data by the individual data processing tasks from the buffer memories which are assigned to the preceding clock pulses of the grid.

11 Claims, 6 Drawing Sheets

Fig. 5

METHOD FOR OPERATING A DATA PROCESSING SYSTEM

FIELD

The present invention relates to a method for operating a data processing system. The method and the data processing system can be used, for example, for processing data for partially automated and highly automated driving, for example in order to process environmental data from the surroundings of a motor vehicle for functions of driver assistance systems. Another area of application for the method described here for operating a data processing system is complex robotic systems.

BACKGROUND INFORMATION

The complexity of data processing in this context is extraordinarily high. Very large volumes of data have to be processed at high speed. Large amounts of memory are required for the data to be processed. At the same time, the safety requirements are greatly increased, especially with regard to the so-called functional safety requirements. No errors must be allowed to occur during the data processing. Taking the functional safety requirements into account also increases system complexity.

Software that is operated on data processing systems for such applications often has a structure in which a complex cascade or a complex of consecutive data processing modules processes input data to form output data, wherein individual data processing modules each process input data to form output data, wherein the output data can then be input data for other data processing modules. The individual data processing modules often function as filters that perform certain data processing functions. This data processing is often an image processing. Input data are often data from sensors (e.g., environmental data, in particular camera images). The individual data processing modules regularly form a complex network. The exchange of output data and input data between the various data processing modules regularly requires efficient mechanisms for the data transfer. At the same time, parallel data processing in different data processing modules is often necessary. This means, for example, that a first data processing module for receiving and processing camera images from an environment camera preferably works in parallel with a further data processing module which further processes the camera images processed by the first data processing module in order to develop decision data for a highly automated driving function on this basis.

In motor vehicles and robotic systems, central control units are usually provided which form the execution platform for software that is used, for example, for autonomous or partially or highly automated driving.

One or more so-called SOC (System on Chip) modules are normally installed in central control units. Each of these SOCs consists internally of a plurality of computing units. The computing units used include, for example, performance cores, safety cores, DSPs (digital signal processors), hardware accelerators, DNNs (deep neural networks), and hardware video image conditioning.

Software that is operated on such hardware and that is intended to effectively utilize the performance of such hardware must be strongly adapted to the hardware. In particular, the desire to utilize many computing units on a single chip as effectively as possible poses extreme challenges in software development and in the analysis of problems in the software/during debugging.

Copying data when transferring between different data processing modules is often to be avoided, for performance reasons. Data processing modules are often intended to read input data from the memory of a SOC module where upstream data processing modules or their data processing steps have stored these data from output data. In this way, copying processes that have to be managed by an operating system can be avoided and the overall data processing performance can be greatly increased.

Approaches in the software structure that make the complexity manageable are extremely important in order to be able to develop and maintain such software efficiently. The keyword "deterministic" operation is extremely important in this context. In particular, in the case of data processing modules that build on one another and operate in parallel with one another, it is important to be able to understand which data processing module is processing which input data at which time. It often also has to be ensured that different data processing modules process the same input data.

Given unordered access to the available input data, in some circumstances this may not be achievable, or may be achievable only with very high effort. Through deterministic communication, here the data on which the particular data processing is based are unambiguously determined. Such determinism can for example be achieved at least in part by means of a temporally predetermined communication, which is characterized in particular by the fact that the times at which input data and output data are exchanged between individual modules are unambiguously determined.

A frequently used principle for the communication of data processing modules is the "single publisher multiple subscriber" scheme (one party can write and publish data, a plurality of parties can have read access to these data). This is one approach to achieving copy-free data transfer. Such copy-free methods for data exchange again increase the complexity because they may require dynamic memory management, which monitors where output data are stored in each case, ensures that there is no unwanted overwriting of output data which are processed by other modules as input data, and so on. In addition, the methods used nowadays often lead to a temporal decoupling of the communication. This requires additional effort in software development and maintenance in order to be able to track which data are processed when and how.

SUMMARY

An object of the present invention is to provide an advantageous method for operating a data processing system.

The present invention relates to a method for operating a data processing system for processing data, wherein the system is set up for the repeated execution of a plurality of different data processing tasks. According to an example embodiment of the present invention, a time grid with a clock pulse is provided for the execution of the individual data processing tasks, a predetermined repetition rate is specified for each data processing task, wherein the repetition rates each define a repetition clock pulse which corresponds in each case to an integer number of clock pulses of the grid;

the repetition clock pulse of the data processing task with the highest repetition rate corresponds to the clock pulses of the time grid;

data processing tasks build on one another, so that at least
one data processing task processes output data of a
further data processing task as input data;

a number of buffer memories are provided, which are
assigned to the clock pulses of the time grid and are
available in turn, so that output data generated during
the respective clock pulse are written to the respective
buffer memory and output data generated during pre-
vious clock pulses for a number of clock pulses are still
available in other buffer memories, wherein the following steps are carried out for the operation
of the data processing system:

a) executing the individual data processing tasks at their
respective repetition rate in the time grid;

b) outputting of output data by the individual data pro-
cessing tasks into the buffer memory assigned to the
clock pulse of the grid;

c) reading in of input data by the individual data process-
ing tasks from the buffer memories which are assigned
to the preceding clock pulses of the grid.

It is preferable for output data of data processing tasks to
be further processed as input data for other data processing
tasks in principle without a copying operation.

According to an example embodiment of the present
invention, output data from data processing tasks are pref-
erably physically stored in the buffer memory. At the exact
location where the output data are stored, further data
processing tasks read in these output data as input data. This
concept can also be referred to as "copy free" communica-
tion. The communication described herein of input data and
output data using the method described herein therefore
preferably takes place in "copy free" fashion. This concept
is applied in particular to the input data and output data
described herein. Other messages can be exchanged between
the data processing modules using other methods (in addi-
tion to the application of the method described herein).

The data processing system is in particular a SOC system
(SOC=System on Chip), which is set up with software to
perform complex data processing tasks that enable, for
example, functions of autonomous, highly automated or
partially automated driving.

According to an example embodiment of the present
invention, the data processing task is preferably carried out
by a data processing module which is set up for carrying out
the corresponding data processing task. The data processing
module is preferably software that is set up to process input
data (e.g. of a camera image or another data set) and
generates output data based on this. The input data prefer-
ably have a specific format, which must be adhered to so that
the data processing module can process said data. The data
processing module is, for example, a filter or a program
function. The data processing task refers to the one-time
execution of the data processing module with specific input
data. Each individual execution of the data processing
module in the grid is referred to as a data processing task. A
plurality of executions of the data processing module in
temporal succession is also referred to as "data processing
tasks." Different types of data processing tasks that build on
each other are also referred to here as a "plurality" of data
processing tasks. Each data processing task can also be
referred to as a "task."

The method according to the present invention described
herein reduces the complexity during communication and
thus enables efficient deterministic communication, even
from a copy-free point of view. This is achieved by using a
deterministic communication concept. The grid of tasks
defines a cyclical task system.

According to an example embodiment of the present
invention, buffer memories are preferably reserved for a
number of clock pulses. For example, there are buffer
memories for a total of 8 clock pulses. Buffer memories are
defined here at the level of the clock pulses. Different data
processing tasks can have their own memory areas within a
clock pulse for storing their output data. Preferably, a
memory area for storing output data of a specific data
processing task is located within a buffer memory for a
specific clock pulse whenever the repetition clock pulse of
the data processing task specifies this. An example: if the
repetition clock pulse of the data processing task corre-
sponds to four times the clock pulse of the grid, then
preferably in every fourth buffer memory for a clock pulse
there is a memory area for the respective data processing
task for storing its output data. The data processing tasks
then place their output data into the buffer memories in turn,
so that (in the present case) every eight clock pulses output
data is written to each buffer memory. For example, one of
the buffer memories is always written to by one of the data
processing tasks, so that the output data from seven previous
executions of the data processing task are then always still
available. This takes place in steps a) and b). During each
clock pulse, there is a unique assignment to a buffer memory
that is "active" for this clock pulse and, if applicable,
associated data processing task (s) whose repetition clock
pulses end at this clock pulse. Data can be written by the data
processing task to this buffer memory. In this case, a write
access to the other seven buffer memories is then not
possible. The data can be read from each of these buffer
memories as input data by other data processing tasks in
accordance with step c). In the present example case of eight
buffer memories, the output data from seven previous execu-
tions of data processing tasks are available. After 8 clock
pulses have passed, the data processing tasks always start
again to overwrite the content of previous executions of the
data processing tasks. This is possible because all the data
processing tasks run in a common time grid. In the example,
after the 8th clock pulse it is ensured that the data from the
previous 7 clock pulses have been received by the other data
processing tasks. The buffer memories of the individual
clock pulses are filled with output data in cyclical/rotating/
rolling fashion by the data processing tasks.

This offers decisive advantages in terms of reducing the
complexity and the expenditure of management and com-
puting time required for communication. In addition, a very
advantageous implementation of deterministic communica-
tion also results from a copy-free point of view.

The method according to the present invention is prefer-
ably designed to be copy-free. "Copy free" means, for
example, that the output data of a data processing task are
not copied, so that they can be used as input data by other
data processing tasks. The data processing tasks retrieve
their input data from the location in the memory where they
were previously stored. The respective areas where data are
stored and read in are permanently stored. It is also particu-
larly advantageous that a static buffer management is static.
Memory areas which form the individual buffer memories
are permanently stored for the entire data processing system
and are preferably not changed during the runtime of the
data processing system.

It has been described that according to an example
embodiment of the present invention, a repetition clock
pulse or repetition rate is preferably defined for the indi-
vidual data processing tasks. The data processing task with the highest repetition rate has the shortest repetition clock pulse, which preferably corresponds to the time grid of clock pulses.

According to an example embodiment of the present invention, preferably, the repetition clock pulses of the individual data processing tasks are in each case integer multiples of each other. The individual data processing tasks can also be referred to as cyclical tasks, which are in an integer cycle relationship to each other.

If indicated, however, the data processing system can be integrated into a higher-level, larger data processing system in which only some of the tasks operate according to the method described here. In such a data processing system, which is higher-level relative to the data processing system described herein, there may therefore be further tasks with which communication preferably does not take place in the manner described here, or takes place with other methods.

According to the present invention, a system of cycles of repetition clock pulses and repetition rates of the data processing tasks working together according to the method described herein can, for example, look as follows:

clock pulse length of the grid: 1 ms [millisecond];

repetition rate of the data processing task with the highest repetition rate: 1000 [1/s repetitions per second]=repetition clock pulse 1 ms [millisecond];

repetition rate of a further data processing task 200 [1/s repetitions per second]=repetition clock pulse 5 ms [milliseconds];

repetition rate of a further data processing task 100 [1/s repetitions per second]=repetition clock pulse 10 ms [milliseconds]; and repetition rate of a further data processing task 10 [1/s repetitions per second]=repetition clock pulse 100 ms [milliseconds].

The transfer of output data from one data processing task as input data to another data processing task is also referred to here as "communication" of the data processing tasks. The communication takes place in deterministic fashion. Communication takes place in "single publisher multiple subscriber" fashion (one is permitted to write and publish data; a plurality are permitted read access to these data).

According to an example embodiment of the present invention, it is also advantageous if data processing tasks intended for execution are activated at the start times of each clock pulse, wherein the start of data processing tasks with a higher repetition rate takes place temporally before the start of data processing tasks with a lower repetition rate.

It is also advantageous if the execution of data processing tasks with a higher repetition rate is prioritized over the execution of data processing tasks with a lower repetition rate.

Preferably, according to an example embodiment of the present invention, an operating system with which the software of the data processing system described herein is operated on hardware and the configuration of this operating system ensures that the higher-frequency data processing tasks have a higher priority and are therefore always preferentially executed. Preferably, activation of the data processing tasks/task activation is done in such a way that the high-frequency data processing tasks are activated earlier than or at least simultaneously with the low-frequency data processing tasks.

In the vast majority of cases, the data processing tasks with the higher repetition rate are started further up, i.e., earlier, in a cascade of data processing tasks, building on one another, of the data processing system described herein. Here is a highly simplified example: the data processing task with the highest repetition rate structures e.g. camera images as input data and outputs them as output data, which are then used by subsequent data processing tasks to perform traffic sign recognition, for example.

According to the present invention, the order of processing, in which the data processing tasks with the highest repetition rate come first, can ensure, for example, that the output data of the data processing tasks with the highest repetition rate are always available when the data processing tasks with the lower repetition rate start. Due to the fact that the data processing tasks with the low repetition rate build on the data processing tasks with the higher repetition rate, the described prioritization causes the data processing system as a whole to behave as if all data processing tasks were started at exactly the same time, which is regularly not possible due to the structure of the hardware and the operating system.

According to an example embodiment of the present invention, it is also advantageous if the buffer memories are structured in such a way that memory areas are provided within the buffer memories for specific output data from data processing tasks.

According to an example embodiment of the present invention, it is also advantageous if, for data processing tasks that obtain input data from buffer memories, it is specified from which memory areas of the buffer memories the input data are to be read.

Memory areas are therefore fixedly defined for individual data processing tasks in the buffer memories. During the runtime of the data processing system, the buffer memories and the memory areas in the buffer memories are preferably not changed.

According to an example embodiment of the present invention, buffer memories preferably exist at the clock pulse level. That is, a buffer memory is provided for each clock pulse. Particularly preferably, these buffer memories are each subdivided into fixedly defined memory areas, each of which forms memory space for storing output data of specific data processing modules or data processing tasks. Thus, each buffer memory preferably contains a plurality of messages from different data processing tasks.

If necessary, the buffer memories for different clock pulses can also be partitioned differently with different memory areas. This can be helpful because, for example, in certain clock pulses it is known that a plurality of data processing tasks are restarted here, so that output data from different data processing tasks are produced. It is also possible that the number of past clock pulses from which output data are held available (not overwritten) is different for different data processing tasks. It is also advantageous to divide the buffer memories into further sub-buffers so that a separation of data can take place. This can be used particularly advantageously to meet safety requirements; i.e., the achievement of "freedom of interference." In particular, it is possible to protect the individual buffer memories from each other with regard to access, to block them for individual data processing tasks, etc. Such functions can be provided by an operating system.

According to an example embodiment of the present invention, it is particularly advantageous if messages between the data processing tasks are only exchanged via the buffer memories, so that communication between the data processing tasks only takes place via the buffer memories.

The term "messages" here refers to input data and output data that are exchanged between the data processing modules in the data processing system that work together according to the method. The term "messages" refers in particular to communication which is not controlled by a higher-level operating system, but which takes place in uncontrolled fashion on the buffer memories between the individual data processing tasks according to the method described here. A higher-level operating system only provides the buffer memories. The exchange of input data and output data is self-organizing according to the method described here. The term "messages" does not refer to other communication that may be required to monitor and control the data processing tasks and that may take place via other channels or the operating system.

According to an example embodiment of the present invention, it is also advantageous if the selection and addressing of the buffer memories is calculated using associated task counters of the data processing tasks involved.

Preferably, according to an example embodiment of the present invention, access to the buffer memory assigned to the respective clock pulse takes place via a mechanism that strictly counts the clock pulses. This mechanism can also be referred to as a clock pulse counter or task counter. The individual buffers can preferably also be addressed quasi-statically using simple arithmetic on the basis of the relationship between the clock pulses of the respective data-sending data processing task and the clock pulses of the respective data-receiving data processing task or of the clock pulse counter/task counter. Dynamic management of the buffers is therefore not necessary. This significantly reduces the effort involved in developing and analyzing the software of the data processing system.

Preferably, according to an example embodiment of the present invention, the addressing of the individual buffer memories is structured in such a way that a memory address of the buffer memory valid in each case can be generated directly from the task counter or the clock pulse counter or the clock pulses of the data-sending and data-receiving data processing tasks involved. Particularly preferably, the current value of the task counter enters into the respective memory accesses during the writing of output data or reading of input data by data processing modules in such a way that no individual consideration of the system of buffer memories is made at all for the programming of the individual data processing module. Due to the structure of the buffer memories in conjunction with the task counter and suitable addressing, the individual data processing tasks preferably automatically store output data in the correct buffer memories and also automatically receive input data from the correct buffer memories.

It is also advantageous if the number of buffer memories is selected so that all input data are available that are required for the execution of each data processing task and that have been generated during previous clock pulses as output data of other data processing tasks.

A relatively large amount of memory in the form of the described buffer memory may have to be reserved in order to use the described method, especially if access to output data further in the past is also required for the data processing according to the described method according to the present invention.

Also described herein is a data processing device according to the present invention comprising one or more processors and one or more memory modules, wherein the data processing device is configured such that it can be operated as a data processing system according to the described method of the present invention.

The data processing device preferably has an operating system which takes over the execution of the individual data processing tasks and the provision of the buffer memories on the memory module (s).

According to an example embodiment of the present invention, the program code of the data processing modules is preferably located on the memory module (s) and is executed on the processors of the data processing device as a data processing task. Through the data processing tasks, the communication of input data and output data takes place on the buffer memory in accordance with the described method.

Further described herein is a computer program product according to the present invention comprising commands which, when the computer program product is executed by a computer, cause the computer to carry out the described method of the present invention.

Further described herein is a computer-readable storage medium according to the present invention comprising commands which, when executed by a computer, cause the computer to carry out the described method of the present invention.

The method and the technical environment of the method of the present invention are explained in more detail below with reference to the figures. The figures show preferred exemplary embodiments of the present invention, to which the method is not limited. It should be noted, in particular, that the figures and in particular the size proportions shown in the figures are only schematic.

BRIEF DESCRIPTION OF THE DRAWINGS

FIG. 5 shows a data processing device for the described method of the present invention.

DETAILED DESCRIPTION OF EXAMPLE EMBODIMENTS

Figure 1:
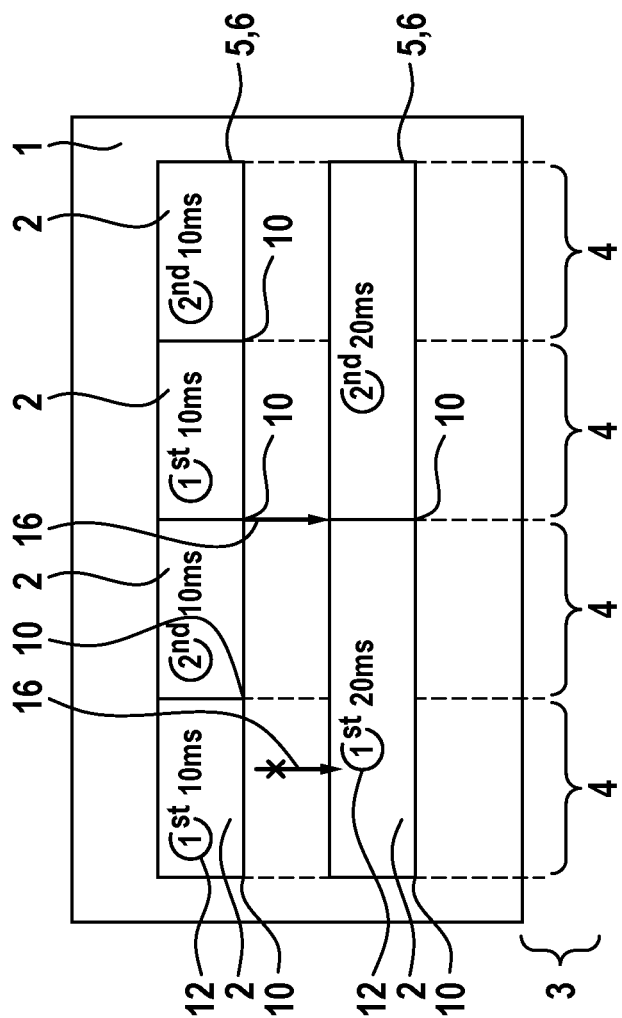
FIG. 1 generally shows a deterministic communication scheme, according to an example embodiment of the present invention.

The representation of data processing systems 1 in FIGS. 1 to 4 is structured in the form of a timeline on which a grid 3 of clock pulses 4 is shown. Different data processing tasks 2 are shown in rows. A plurality of executions of data processing tasks 2 with different input data 7 are shown one after the other in each row. The data processing tasks 2 are executed repeatedly in the grid 3 of clock pulses 4 with predefined repetition rates 5 and repetition clock pulses 6. This representation of a data processing system 1 serves the purpose of visualizing the communication between data processing tasks 2. Each data processing task 2 is represented as a block which is integrated into the grid 3 of clock pulses 4. Each data processing task 2 has a start time 10. Preferably, for each type of data processing task 2 there is a task counter which counts through the individual repetitions of the respective data processing task 2.

FIG. 1 generally illustrates a deterministic task system for starting data processing tasks 2 in a data processing system 1 which is frequently used. The data processing tasks 2 are executed repeatedly in the grid 3 of clock pulses 4 with predefined repetition rates 5 and repetition clock pulses 6. Here, the communication of output data 8 and input data 7 between individual data processing tasks 2 takes place deterministically, but in the form of messages 16 which are exchanged individually between individual data processing tasks 2, the exchange of which may have to be controlled by an operating system. The effort required to develop the program code for data exchange is considerable here.

Deterministic communication is characterized by the fact that messages 18 are always exchanged at fixed times, for example (as shown here) at the end of a clock pulse. The exchange of messages 16 at arbitrary times is prohibited. A corresponding prohibited message 18 (i.e. not permissible in the context of deterministic communication) is shown crossed out in FIG. 1.

Preferably, principles such as "single publisher multiple subscriber" (one is permitted to write and publish data and a plurality are permitted read access to these data) are also used in the schemata according to FIG. 1 to enable copy-free solutions for exchanging the messages 16 between the data processing tasks 2. In these so-called copy-free methods, complexity increases further, since, for example, dynamic buffer management becomes necessary.

Figure 2:
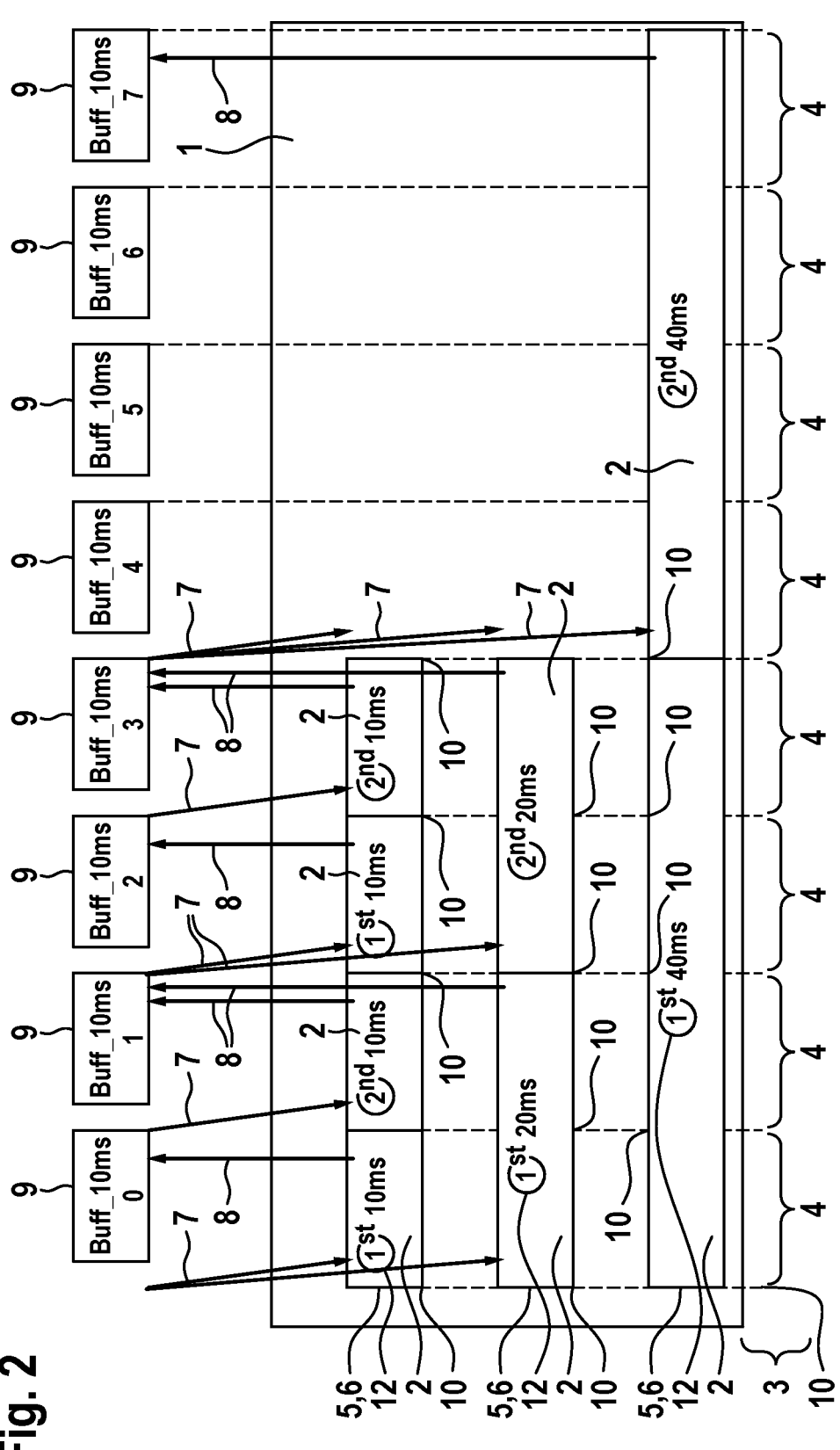
FIG. 2 shows a first variant embodiment of deterministic communication via buffer memories, according to the present invention.

FIG. 2 shows a first variant embodiment of deterministic communication via buffer memories 9 according to the method described herein. Buffer memories 9 are assigned to each of the clock pulses 4 of the grid 3. There is no exchange of individual messages 16 as in FIG. 1, but instead output data 8 are written to currently active buffer memories 9 and input data 7 are read in from buffer memories 9 previously filled with output data 8. To reduce complexity and due to the fact that communication between the data processing tasks 2 takes place exclusively via the buffer memories 9, buffer management preferably takes place at task granularity and not at message granularity. Or in other words: an operating system which provides the environment for the described data processing system 1 and the described method provides the memory for the buffer memories 9 and not the memory for the individual messages 16. This significantly reduces the number of memory areas 11 to be managed and the communication management effort, compared to management based on the individual communication messages.

Preferably, the buffers for communication are defined statically, i.e. at compile time, and are not changed during the runtime of the data processing system 1. During running operation, access is thus determined by the task activation or the task counter 12. Simple arithmetic is sufficient to determine the buffer memory 9. "True buffer management" is preferably not necessary. Preferably, only targeted access to the correct buffer memory 9 takes place, via addresses that are generated using the task counter 12. It is unambiguously defined for each task which buffer is to be used when.

Figure 3:
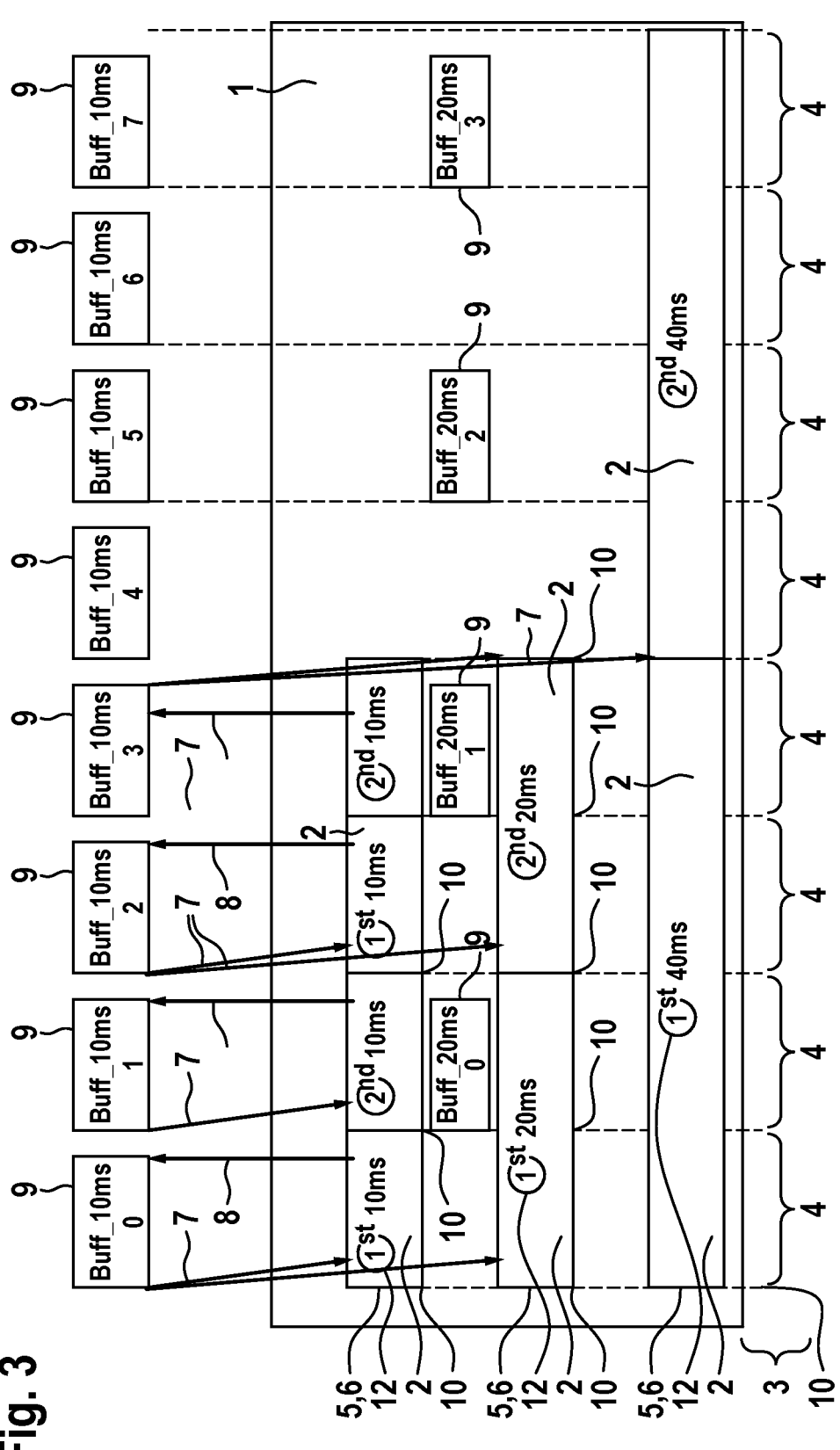
FIG. 3 shows a second variant embodiment of deterministic communication via buffer memories, according to the present invention.

FIG. 3 shows a second variant embodiment of deterministic communication via buffer memories 9 in a data processing system 1. FIG. 3 is based on FIG. 2, and therefore FIG. 2 can be used here to explain FIG. 3. Here, buffer memories 9 are not only defined for each individual clock pulse 4, but instead individual buffer memories 9 preferably exist in the clock pulse grid for particular communication partners. The term communication partners here means data processing tasks 2 which communicate with one another. This means that one data processing task 2 provides certain output data 8 on a recurring basis that are processed by another data processing task 2. The scheme of which data processing task 2 communicates with which other data processing task 2 is fixed and therefore deterministic. The deterministic communication scheme and the cyclic task scheme enable static management of the buffer memories 9. Preferably, addressing of the buffer memories 9 takes place here based on the fixed communication partners (e.g. in each case via an ID of the communication partners (data processing tasks 2)) and via the task counter 12. Access to the buffers takes place in copy-free fashion as "single publisher multiple subscriber". The addressing of the individual buffers is then determined by the assignment of the communication participants to their tasks. If, for example, in the example shown in FIG. 3 definition takes place as follows:

2nd 20 ms task receives Buff_10 ms_1: the 2nd 20 ms task uses the task counter of the 10 ms task and the task counter of the 20 ms task and the clock pulse ratio of 10 ms to 20 ms to calculate the correct 10 ms buffer using simple arithmetic;

2nd 40 ms task receives the Buff_10 ms_3 and the Buff_20 ms_1: the 2nd 40 ms task uses the task counter of the 10 ms task and the task counter of the 40 ms task and the clock pulse ratio of 10 ms to 40 ms to calculate the correct 10 ms buffer using simple arithmetic. And the 2nd 40 ms task uses the task counter of the 20 ms task and the task counter of the 40 ms task and the clock pulse ratio of 20 ms to 40 ms to calculate the correct 20 ms buffer using simple arithmetic;

1st 10 ms task sends the Buff_10 ms_1: the 1st 10 ms task uses the task counter of the 10 ms task to calculate the correct 10 ms buffer using simple arithmetic;

etc.

Preferably, the communication from one execution of a data processing task 2 to the next execution of the same data processing task 2 can be carried out according to the same method. This refers to the case where a data processing task processes output data 8 from a previous execution as input data 7. In this case, a data processing task 2 communicates with itself, so to speak, or takes internal, changing status variables into account when processing further input data 7. This case could also be solved using other approaches, e.g. a reserved internal buffer memory 9 for the respective data processing task 2. However, it can likewise be advantageous to also act uniformly in this case using the described method. Preferably, less buffer memory 9 could then be required for this.

Advantageously, the number of buffers can be reduced, advantageously on the basis of the actually required communication of output data 8 and input data 7 between data processing tasks 2. FIG. 3 can be used to explain such a reduction, for example for the 40 ms data processing task 2. If this data processing task 2 did not have to receive any data from the 10 ms data processing task 2, then here the number of ms buffer memories 9 could be halved from 8 to 4.

The described method and the described data processing system 1 also open up the possibility of being able to access a plurality of buffer memories 9 simultaneously without extra effort. Since the buffer memories 9 are statically defined and the clock pulses 4 or the repetition clock pulses 6 are in an integer cycle relationship to each other, a low-frequency data processing task 2 with a low repetition rate 5, for example, can access all the data of the higher-frequency data processing tasks 2 with a higher repetition rate 5. Preferably, this applies with the restriction that only output data 8 are available that were generated in the previous activation period of the associated low-frequency data processing task 2.

Figure 4:
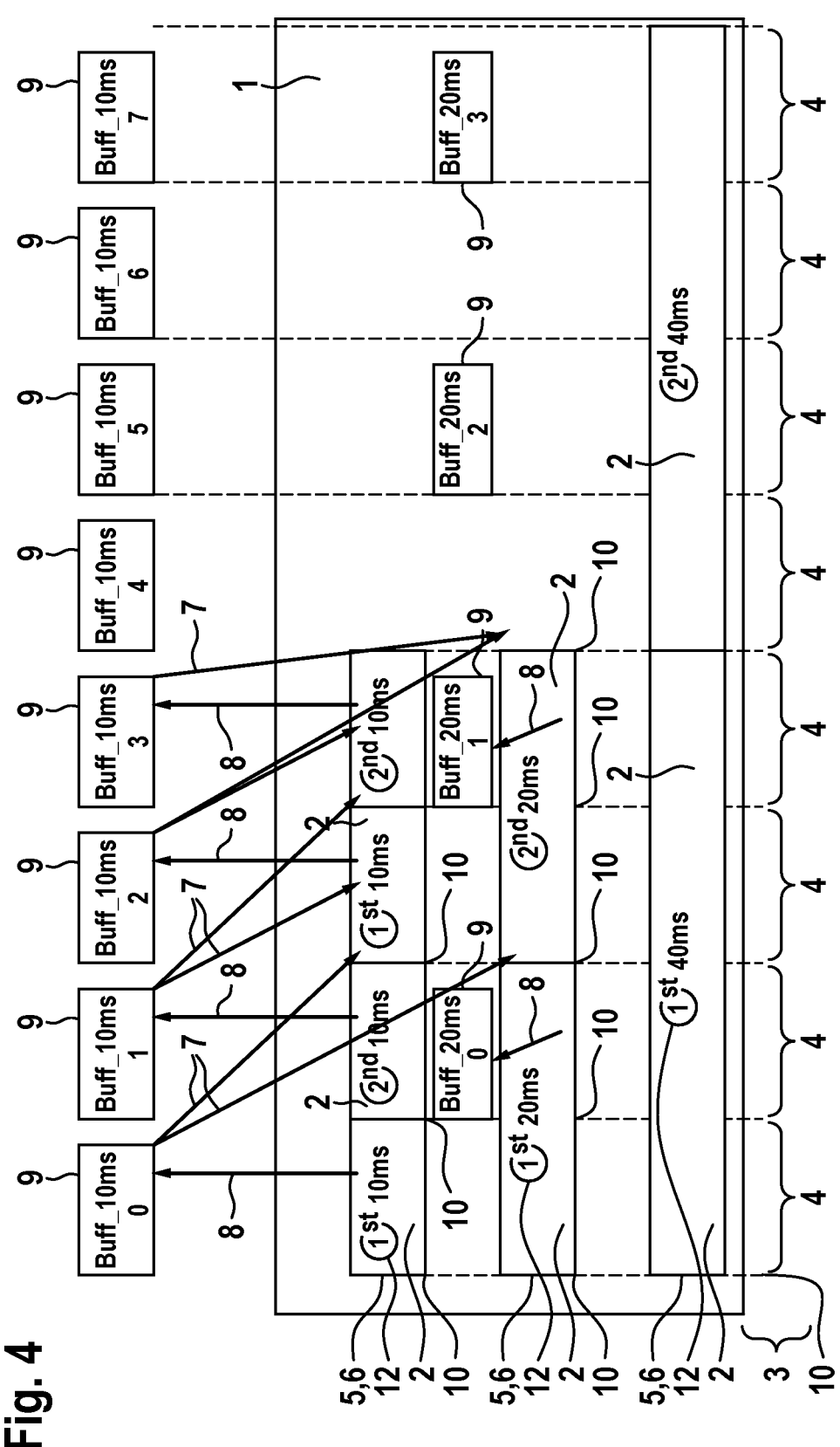
FIG. 4 shows a third variant embodiment of deterministic communication via buffer memories, according to the present invention.

FIG. 4 shows another development; here FIG. 2 and FIG. 3 are also used to explain FIG. 4. In addition, the static allocation of the buffer memories 9 also enables deterministic access to data from multiple activations of higher-frequency data processing tasks 2. This simplifies the processing of data from higher-frequency data processing tasks 2 without the complexity otherwise required to identify and access these data. In the example in FIG. 4, this is done for example as follows:

2nd 20 ms task accesses the data of the 1st and 2nd 10 ms task;

2nd 40 ms task accesses the data from Buff_10 ms_2 and Buff_10 ms_3;

2nd 40 ms task accesses Buff_10 ms_0, Buff_10 ms_1, Buff_10 ms_2 and Buff_10 ms_3;

etc.

Figure 5:
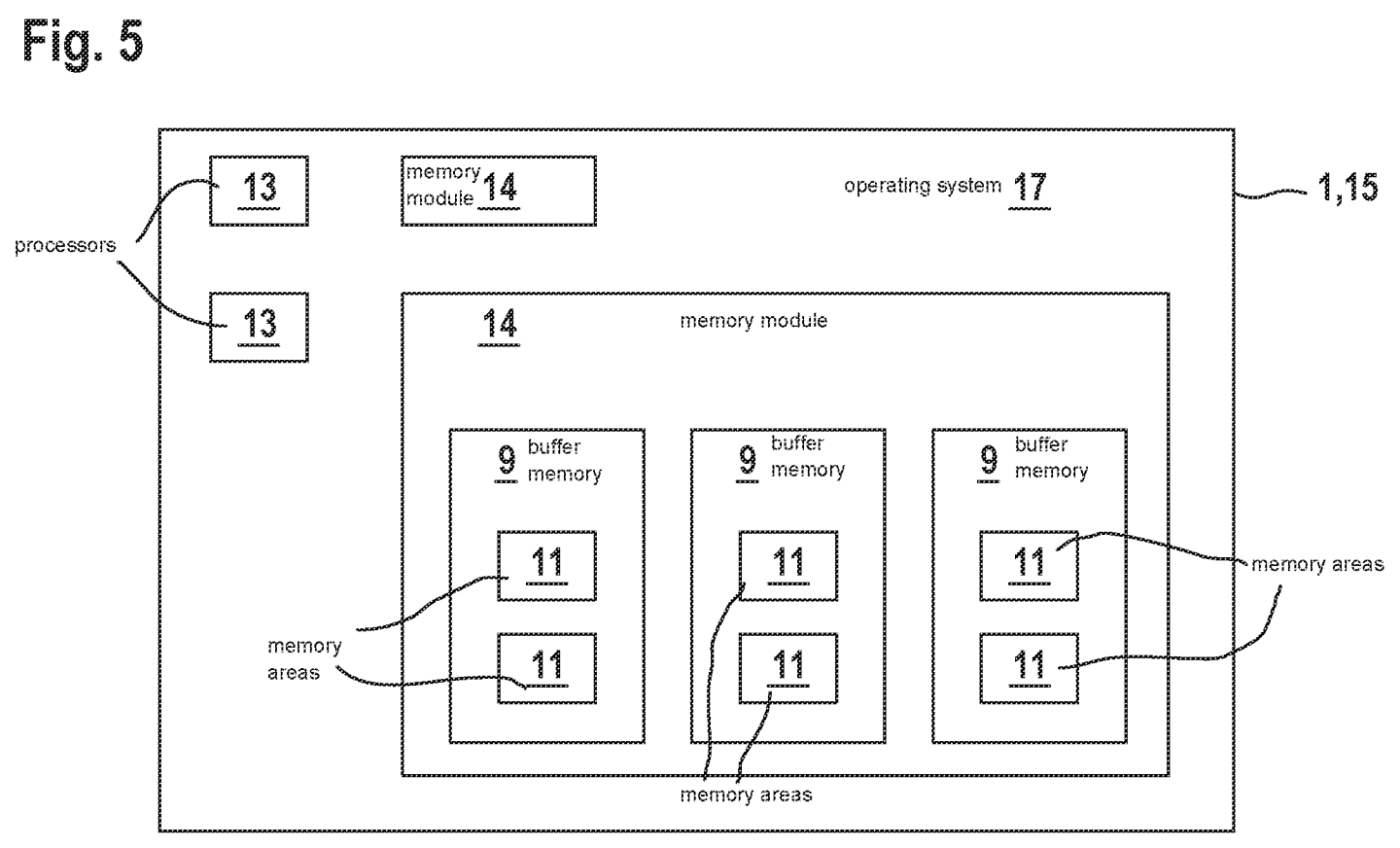

FIG. 5 schematically shows a data processing device 15 (e.g. a SOC system) for the described method. The data processing device preferably comprises processors 13 and memory modules 14. The buffer memories 9, which are optionally subdivided into individual memory areas 11, are reserved on the memory modules 14. The program code of the data processing modules, which are executed as data processing tasks 2, is preferably also stored on the memory modules 14. An operating system 17 is preferably operated on the data processing device 15, which operating system manages the memory modules 14 and the processors 13 as resources and provides same for the described method. The data processing device 15 forms the data processing system 1 with the program code of the data processing modules and if appropriate also with the necessary functions of the operating system 17.

Figure 6:
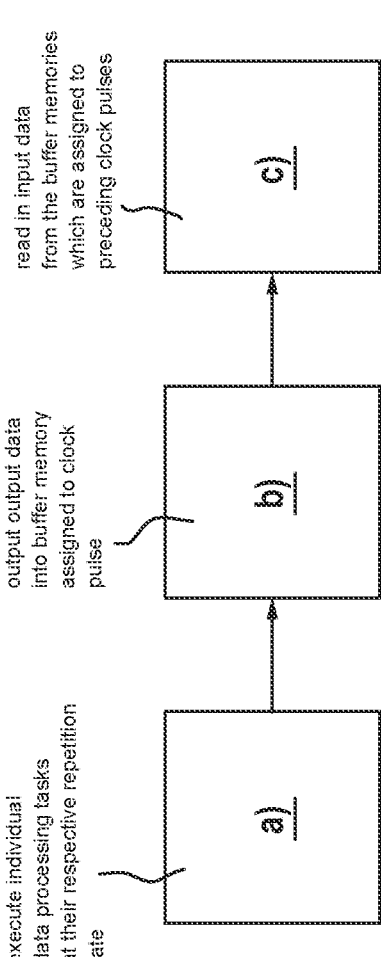
FIG. 6 shows a flowchart of the described method according to an example embodiment of the present invention.

FIG. 6 shows, very schematically, a flowchart of the described method. The individual method steps a), b) and c) are shown, which are carried out according to the described method.

The invention claimed is:

1. A method for operating a data processing system for processing data, wherein: (i) the data processing system is set up for repeated execution of a plurality of individual data processing tasks, (ii) a time grid with a base clock pulse is provided for the execution of the individual data processing tasks, (iii) a respective predetermined repetition rate is specified for each of the individual data processing tasks, (iv) each of the respective repetition rates defines a repetition clock pulse which corresponds in each case to a respective integer number of instances of the base clock pulse of the grid, (v) one of the repetition clock pulses, which corresponds to one of the individual data processing tasks that has a highest repetition rate of all of the plurality of individual data processing tasks, is equal to the base clock pulse of the time grid, (vi) the individual data processing tasks build on one another so that at least one of the data processing tasks processes output data of a further one of the data processing tasks as input data, and (vii) a number of buffer memories are provided, which are assigned to respective instances of the base clock pulse of the time grid and which are available in turn, so that output data generated during a respective instance of the base clock pulse are written to a respective buffer memory of the buffer memories and output data generated during previous instances of the base clock pulse continue to be available in others of the buffer memories for a number of instances of the base clock pulse; and wherein the method comprises carrying out the following steps for the operation of the data processing system:

a) executing each of the data processing tasks at its respective repetition rate in the time grid;

b) outputting respective portions of the output data by one or more of the individual data processing tasks, each into the respective one of the buffer memories assigned to the respective instance of the base clock pulse of the grid in which the respective individual data processing task is executed; and c) reading in respective portions of the input data by one or more of the individual data processing tasks from the buffer memories which are assigned to the preceding instances of the base clock pulse of the grid.

2. The method according to claim 1, wherein at least a portion of the output data generated by a first subset of the data processing tasks is further processed as a portion of the input data used by a further subset of the data processing tasks without a copying operation.

3. The method according to claim 1, wherein messages between the data processing tasks are exchanged only via the buffer memories, so that communication between the data processing tasks takes place only via the buffer memories.

4. The method according to claim 1, wherein:

for each instance of the base clock pulse at which one or more of the data processing tasks are intended for execution, the one or more of the data processing tasks intended for execution at the respective instance are activated at a start time of the respective instance of the base clock pulse; and for each instance of the base clock pulse at which at least two of the data processing tasks are intended for execution, respective starts of execution of the at least two of the data processing tasks take place in an order that corresponds to their respective repetition rates so that, for each pair of the at least two data processing tasks that have different repetition rates, the respective execution start of whichever has a higher one of the repetition rates takes place temporally before the respective execution start of the other.

5. The method according to claim 1, wherein execution of those of the data processing tasks with a higher repetition rate are prioritized over execution of those of the data processing tasks with a lower repetition rate.

6. The method according to claim 1, wherein the buffer memories are structured in such a way that memory areas provided for specific output data from data processing tasks are provided within the buffer memories.

7. The method according to claim 6, wherein, for those of the data processing tasks that obtain input data from the buffer memories, it is specified from which memory areas of the buffer memories the input data are to be read.

8. The method according to claim 7, wherein selection and addressing of the buffer memories is calculated using associated task counters of those of the data processing tasks involved.

9. The method according to claim 1, wherein the number of buffer memories is such that all of the input data that are generated as output data by one or more of the data processing tasks during any of the instances of the base clock pulse and that also are respectively required for the execution, subsequently, of one or more other ones of the data processing tasks remain respectively available to those other data processing tasks via the buffer memories.

10. A data processing device, comprising:

one or more processors; and one or more memory modules;

wherein:

(i) the data processing device is configured to process data via execution of a plurality of individual data processing tasks using the one or more processors;

(ii) a time grid with a base clock pulse is provided for the execution of the individual data processing tasks;

(iii) a respective predetermined repetition rate is specified for each of the individual data processing tasks;

(iv) each of the respective repetition rates defines a repetition clock pulse which corresponds in each case to a respective integer number of instances of the base clock pulse of the grid;

(v) one of the repetition clock pulses, which corresponds to one of the individual data processing tasks that has a highest repetition rate of all of the plurality of individual data processing tasks, is equal to the base clock pulse of the time grid;

(vi) the individual data processing tasks build on one another so that at least one of the data processing tasks processes output data of a further one of the data processing tasks as input data;

(vii) the one or more memory modules include a number of buffer memories, which are assigned to respective instances of the base clock pulse of the time grid and which are available in turn, so that output data generated during a respective instance of the base clock pulse are written to a respective buffer memory of the buffer memories and output data generated during previous instances of the base clock pulse continue to be available in others of the buffer memories for a number of instances of the base clock pulse; and (viii) the data processing device is configured to:

a) execute each of the data processing tasks at its respective repetition rate in the time grid;

b) output respective portions of the output data by one or more of the individual data processing tasks, each into the respective one of the buffer memories assigned to the respective instance of the base clock pulse of the grid in which the respective individual data processing task is executed; and c) read in respective portions of the input data by one or more of the individual data processing tasks from the buffer memories which are assigned to the preceding instances of the base clock pulse of the grid.

11. A non-transitory computer-readable storage medium on which are stored commands for operating a data processing system for processing data, wherein: (i) the data processing system is set up for the repeated execution of a plurality of individual data processing tasks, (ii) a time grid with a base clock pulse is provided for the execution of the individual data processing tasks, (iii) a respective predetermined repetition rate is specified for each of the individual data processing tasks, (iv) each of the respective repetition rates defines a repetition clock pulse which corresponds in each case to a respective integer number of instances of the base clock pulse of the grid, (v) one of the repetition clock pulses, which corresponds to one of the individual data processing tasks that has a highest repetition rate of all of the plurality of individual data processing tasks, is equal to the base clock pulse of the time grid, (vi) the individual data processing tasks build on one another so that at least one of the data processing tasks processes output data of a further one of the data processing tasks as input data, and (vii) a number of buffer memories are provided, which are assigned to respective instances of the base clock pulse of the time grid and which are available in turn, so that output data generated during a respective instance of the base clock pulse are written to a respective buffer memory of the buffer memories and output data generated during previous instances of the base clock pulse continue to be available in others of the buffer memories for a number of instances of the base clock pulse; and wherein the commands, when executed by a computer, cause the computer to perform the following steps for the operation of the data processing system:

a) executing each of the data processing tasks at its respective repetition rate in the time grid;

b) outputting respective portions of the output data by one or more of the individual data processing tasks, each into the respective one of the buffer memories assigned to the respective instance of the base clock pulse of the grid in which the respective individual data processing task is executed; and c) reading in respective portions of the input data by one or more of the individual data processing tasks from the buffer memories which are assigned to the preceding instances of the base clock pulse of the grid.

\* \* \* \* \*